(12) United States Patent
Khoshgard et al.

(10) Patent No.: US 10,193,585 B2
(45) Date of Patent: Jan. 29, 2019

(54) TONE REMOVAL FOR DIGITAL CIRCUITS

(71) Applicant: SiTune Corporation, San Jose, CA (US)

(72) Inventors: Mahdi Khoshgard, Los Gatos, CA (US); Vahid Mesgarpour Toosi, Los Altos, CA (US); Marzieh Veyseh, Los Altos, CA (US)

(73) Assignee: SiTune Corporation, San Jose, CA (US)

( * ) Notice: Subject to any disclaimer, the term of this patent is extended or adjusted under 35 U.S.C. 154(b) by 0 days.

(21) Appl. No.: 15/436,516

(22) Filed: Feb. 17, 2017

(65) Prior Publication Data
US 2018/0241423 A1 Aug. 23, 2018

(51) Int. Cl.
| *H03M 1/06* | (2006.01) |
| *H03M 1/08* | (2006.01) |
| *H04B 1/00* | (2006.01) |
| *H04B 1/12* | (2006.01) |

(52) U.S. Cl.
CPC ............ *H04B 1/12* (2013.01); *H03M 1/0626* (2013.01); *H03M 1/0631* (2013.01); *H03M 1/08* (2013.01); *H03M 1/0836* (2013.01); *H04B 1/0003* (2013.01)

(58) Field of Classification Search
CPC ......... H04B 1/12; H04B 1/0003; H03M 1/12; H03M 1/001; H03M 1/0626; H03M 1/0631; H03M 1/08; H03M 1/0836; H03M 1/1019
See application file for complete search history.

(56) References Cited

U.S. PATENT DOCUMENTS

| 4,761,634 | A | * | 8/1988 | Yamaguchi | ......... | H03M 1/0639 |
| | | | | | | 341/131 |
| 5,029,118 | A | * | 7/1991 | Nakajima | .......... | H03H 21/0012 |
| | | | | | | 702/195 |
| 5,872,818 | A | * | 2/1999 | Choi | ..................... | H04L 7/0029 |
| | | | | | | 375/324 |
| 6,271,781 | B1 | * | 8/2001 | Pellon | ................... | H03M 3/388 |
| | | | | | | 341/143 |
| 7,924,329 | B2 | * | 4/2011 | Suzuki | ................... | H04N 5/361 |
| | | | | | | 348/241 |
| 2007/0086533 | A1 | * | 4/2007 | Lindh | ................ | H04L 27/0014 |
| | | | | | | 375/260 |
| 2015/0263746 | A1 | * | 9/2015 | Shiraishi | ............ | H03M 1/0836 |
| | | | | | | 341/144 |

* cited by examiner

*Primary Examiner* — David B Lugo
(74) *Attorney, Agent, or Firm* — Hogan Lovells US LLP

(57) ABSTRACT

The present disclosure relates to a method and system for tone signal removal from a noisy signal that includes a desired signal in combination with the tone signal. The method and system provides an artificial or estimated undesired tone signal with the same frequency as the undesired tone signal, which, in combination with an estimated phasor, is available to filter or subtract a noisy component from the noisy signal and to provide the filtered or clean desired signal.

16 Claims, 3 Drawing Sheets

TONE REMOVAL FOR DIGITAL CIRCUITS

TECHNICAL FIELD

The present disclosure generally relates to modem technology and to filtering of tone signals from a noisy signal using novel integrated circuits in a communications network.

BACKGROUND

A network for communications, including for cable television, phone, and internet data traffic, typically includes a base station, one or more head-ends, one or more intermediate hubs, and the subscriber facilities. The subscriber facilities typically represent the end of the line and include one or more modems, routers, and the consuming technology—phones, televisions, computers, laptops, electronic tablets, smartphones, InternetOfThings (IoT) devices, and other internet-enabled devices.

Receivers may have digital components working together with analog components as a system-on-a-chip (SoC). Typically, there are many different synthesizers and clock sources in digital and analog components. Even with good layout and circuit design for a printed circuit board (PCB), undesired leaking of tone signals occurs toward the analog front-end features from other circuit and chip components, such as, the crystal oscillator, digital clocks, and synthesizers. These undesired tone signals may also be inside the desired signal bandwidth for these circuit and chip components. Certain system may use a band-stop filter to filter the undesired tone signals, but such implementations filter the desired signal as well.

In certain schemes, an undesired signal is supressed before the noisy signal is passed through an analong-to-digital convertor (ADC) so that the undesired signals are not present in the digital signal. This, however, adds extra complexities and cost. In some implementations using these schemes, it is impossible to detect all of the undesired signals in the analog domain. As a result, additional steps are needed to redesign the circuits after detecting the tone signals in the digital domain in order to suppress them in the analog domain.

SUMMARY

The present disclosure resolves deficiencies in the typical processes of eliminating undesired tone signals from a noisy signal that includes at least a desired signal in combination with at least an undesired signal of known frequency. The undesired signal of known frequency is typically sourced from analog components such as crystals, synthesizers, etc. The present disclosure, however, reduces the complexity of redesigning circuits while increasing the accuracy of detecting the undesired signals and eliminating them in the digital domain. Pertinently, the present disclosure provides an artificial tone signal with the same frequency as the undesired tone signals, which, in combination with an estimated phasor, is subtracted from the noisy digital signal, thereby providing the clean digital signal that is desired.

In an implementation, the present disclosure is to a system including an analog-to-digital converter (ADC), a digital single tone signal generator, a phase estimator, and a subtractor circuit. The ADC is for converting a noisy analog signal to a noisy digital signal. The noisy analog signal includes a first signal (e.g., original desired signal) and a second signal (e.g., undesired tone signal), where the second signal is of a first frequency (e.g., a known frequency). The tone signal generator is for providing a third signal (e.g., single tone reference signal) including the first frequency. The phase estimator circuit is for generating an estimated phasor value that when multiplied with the third signal provides a fourth signal (e.g., estimated undesired tone signal). The subtractor circuit is for filtering the fourth signal from the noisy digital signal. The subtractor circuit, by the filtering, removes a noisy component from the noisy digital signal and provides a filtered signal (e.g., the digitalized desired signal without the digitalized undesired tone signal).

In another implementation, the present disclosure is to a method that includes the following features. A converting feature, using an analog-to-digital converter (ADC), converts a noisy analog signal to a noisy digital signal. The noisy analog signal includes a first signal (e.g., original desired signal) and a second signal (e.g., undesired tone signal), where the second signal is of a first frequency (e.g., a known frequency). A providing feature, using a digital single tone signal generator, provides a third signal (e.g., single tone reference signal) including the first frequency. Another providing feature of the present method uses a phase estimator circuit to provide an estimated phasor value that when multiplied with the third signal further provides a fourth signal (e.g., estimated undesired tone signal). A subtracting process is applied using a subtractor circuit to subtract the fourth signal from the noisy digital signal. The subtracting removes a noisy component from the noisy digital signal and provides a filtered signal (e.g., the digitalized desired signal without the digitalized undesired tone signal).

BRIEF DESCRIPTION OF THE DRAWINGS

The accompanying drawings constitute a part of this specification and, together with the specification, illustrate certain exemplary implementations of this disclosure.

DETAILED DESCRIPTION

Systems and methods in accordance with various embodiments of the present disclosure may overcome one or more of the aforementioned and other deficiencies experienced in conventional approaches to filter undesired tone signals in a noisy signal. Embodiments herein provide a method for integrated circuit implementation, which includes a system with an analog-to-digital converter (ADC), a digital single tone signal generator, a phase estimator, and a subtractor circuit. The ADC is for converting a noisy analog signal to a noisy digital signal. The noisy analog signal includes a first signal (e.g., original desired signal) and a second signal (e.g., undesired tone signal), where the second signal is of a first frequency (e.g., a known frequency). The digital single tone signal generator is for providing a third signal (e.g., single tone reference signal) including the first frequency. The phase estimator circuit is for generating an estimated phasor value that when multiplied with the third signal provides a fourth signal (e.g., estimated undesired tone signal). The subtractor circuit is for filtering the fourth signal from the noisy digital signal. The subtractor circuit, by the filtering, removes a noisy component from the noisy analog signal and provides a filtered signal.

Various other functions and advantages are described and suggested below as may be provided in accordance with the various embodiments.

Figure 1:
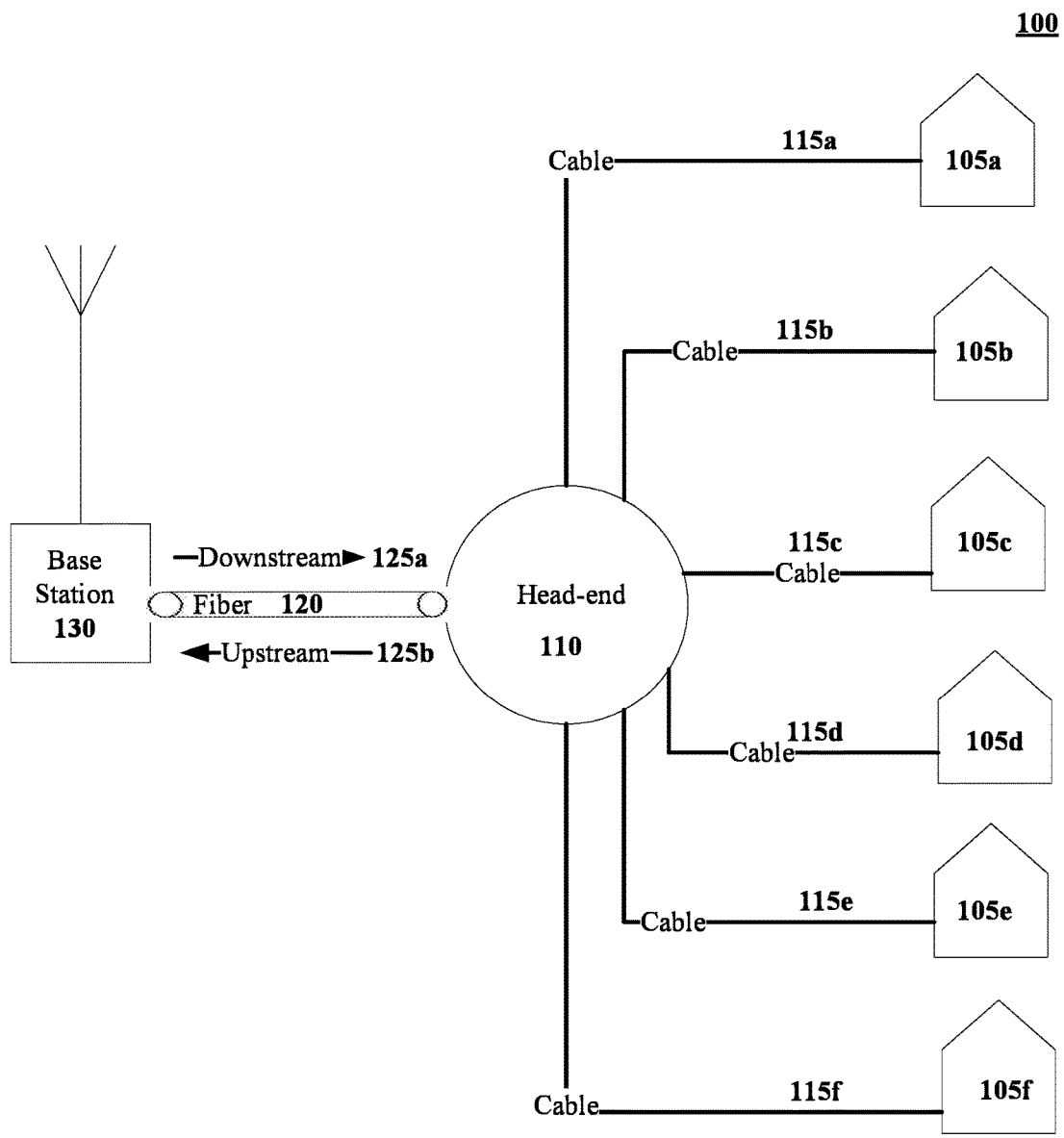
FIG. 1 illustrates an exemplary communications network in accordance with various embodiments.

FIG. 1 illustrates a communications network 100, where the present disclosure is applicable, in one aspect. The communications network 100 includes at least a base station 130, a head-end 110, and subscriber facilities 105a-f. The base station 130 is typically in communication with the head-end via fiber 120, although other communication systems, including physical and virtual (e.g., wired and wireless) systems may connect the base station 130 to the head-end 110. The head-end is in communication with the subscriber facilities 105 via cable 115a-f, although other communication systems, including fiber (similar to the base station's connection with the head-end), or other physical and virtual (e.g., wired and wireless) systems may connect the head-end 110 to the subscriber facilities 105. The communications network 100 supports upstream and downstream traffic via both the fiber 125—where the traffic is illustrated as element numeric 125a-b, and the cable 115.

The subscriber facilities 105 include modems and, optionally, routers, both of which may be wired or wireless type devices. The upstream and downstream signals from cable 115 transmit digital signals carrying data for voice, telephony, television, and other services, over radio frequency (RF) carrier signals to the modem. In a two-way communication network, one or more carrier signals are designated to transmit data in the downstream direction, from the head-end to the modem at a subscriber facility 105, while other carrier signals are designated to transmit data in the upstream direction, from the subscriber facility 105 to upstream components in the communications network 100, e.g., the head-end 110, and subsequently, the base station 130. The modems at each subscriber facility 105 convert the data as required for the upstream or downstream transmission—for e.g., from a digital format to a RF modulated signals in the upstream direction into the communications network 100, and from RF signals to digital format for the downstream direction consuming devices. A cable modem termination system (CMTS) performs the opposite operation for multiple subscribers at the cable operator's head-end.

The downstream and upstream transmissions can occur in, for example, a 6 MHz bandwidth channel. As described above, the downstream portion is designated to a predetermined portion of the available bandwidth, with the upstream portion designated to the remainder. Moreover, subscriber facilities that are condominium-styled facilities are designated to share bandwidth from singular cables, in some instances. The use of the present filter system is required in these networks for at least filtering unwanted tone signals that are typical in shared bandwidth systems.

Figure 2:
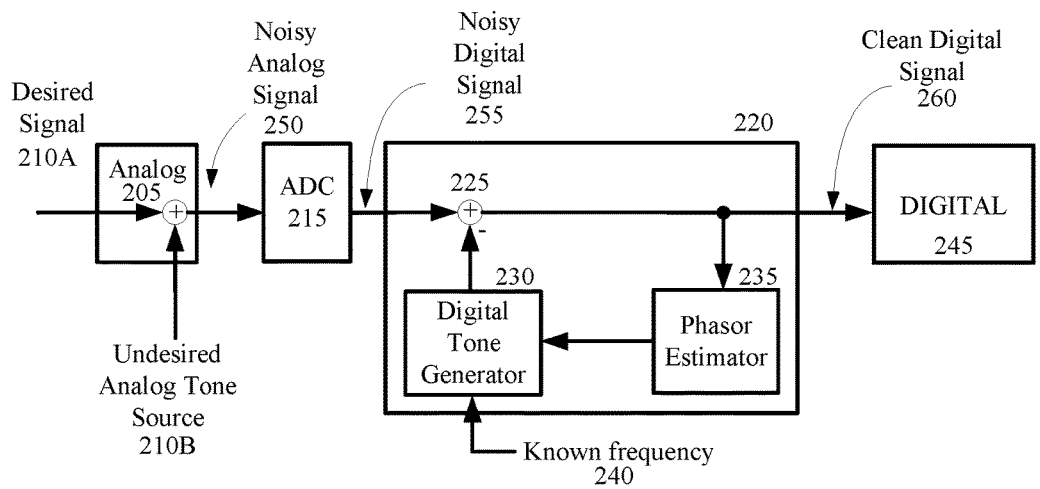
FIG. 2 is a block diagram of a filtering system for tone signal removal, in accordance with various embodiments of the present disclosure.

FIG. 2 is a block diagram of a filtering system 200 for tone signal removal, in accordance with various embodiments of the present disclosure. A desired signal is provided via source 210A to the analog summing circuit 205. An undesired tone signal, representing unwanted signals, is illustrated as entering the system via source 210B to the analog summing circuit 205. In an embodiment, such source 210B includes crystal oscillators, synthesizers, and other signal provisioning components. A person of ordinary skill would recognize that the unwanted or undesired tone signals may enter the desired bandwidth through any component of the circuit. The undesired tone signal, in one example, is a signal of a known frequency but with an unknown amplitude or phase. An ADC 215 is provided to convert the noisy analog signal 250 received from the analog summing circuit 205 to a noisy digital signal on output 255. Filtering or subtracting component 220 is provided to filter or subtract the undesired tone signal from the desired bandwidth. Pertinently, a known frequency is provided via source 240 into a digital tone signal generator 230. The digital tone signal generator 230 provides an artificial digital tone signal of the known frequency (as the undesired tone signal) to the subtracting/filtering circuit 225 of the filtering component 220.

FIG. 2 also illustrates a phasor estimator circuit 235 providing a phasor estimate to the digital tone signal generator 230. The phasor estimate is estimated amplitude and estimated phase for the filtering or subtracting component 220. The digital tone signal generator 230 uses the phasor estimate, in combination with the known frequency from input 240, to generate an artificial unwanted or undesired tone signal. The artificial unwanted or undesired tone signal is provided to the subtracting/filtering circuit 225 which applies it to subtract or filter the noisy undesired tone signals in the noisy digital signal, prior to providing the wanted or clean desired signal 260 for digital output via port 245. The subtractor or filter circuit 225, by the subtracting or filtering of the noisy undesired tone signals removes a noisy component from the noisy digital signal and provides a filtered signal representing the clean desired signal 260 at the output 245.

Figure 3:
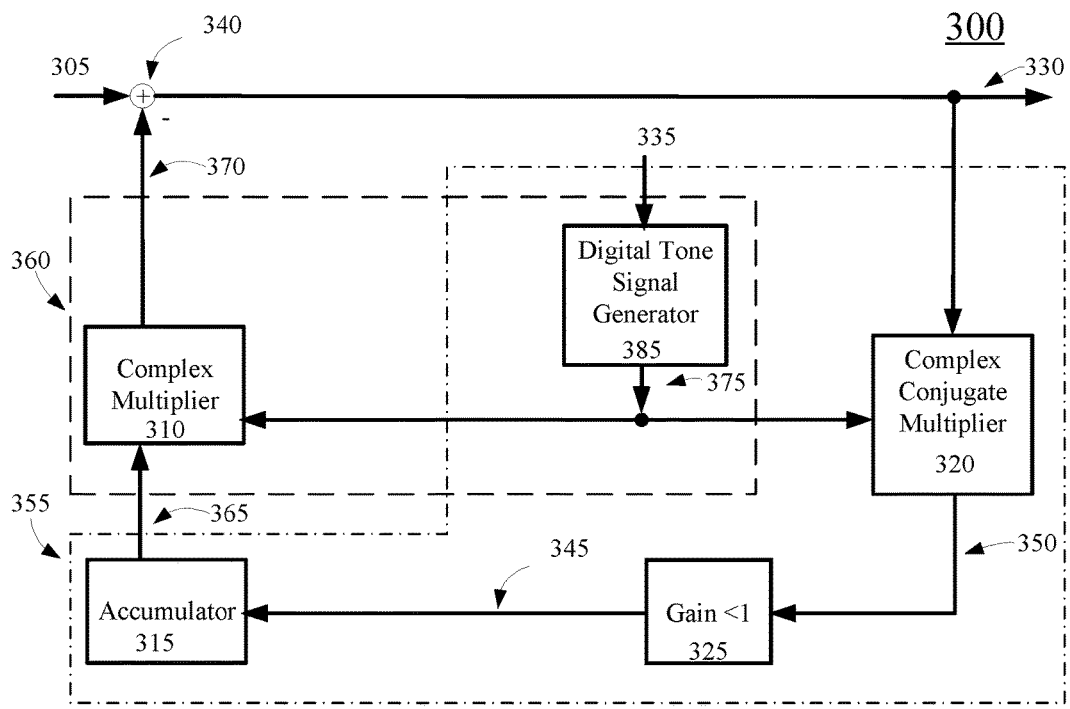
FIG. 3 is another block diagram of a filtering system for tone signal removal, in accordance with various embodiments of the present disclosure.

FIG. 3 is another block diagram of a filtering system 300 for tone signal removal, in accordance with various embodiments of the present disclosure. The noisy analog signal is illustrated as entering the system 300 via source 305. The system 300 includes a complex multiplier 310, a digital tone signal generator 385, a complex conjugate multiplier 320, a gain circuit 325, an accumulator circuit 315, and at least subtracting/filtering circuits 340. The components within the dotted lines forming virtual block 360 are components pertaining to functions for a digital tone signal generator, while components within the dotted lines forming virtual block 355 are components directed pertaining to functions for a phasor estimator circuit.

The noisy analog baseband signal, in complex format of in-phase (I) and quadrature-phase (Q) is provided from source 305, as $X[n]=X_I[n]+j\ X_Q[n]$ (equation 1). The filtered output digital signal via output 330 is also a baseband signal in complex format (using I and Q phases), presented as: $Y[n]=Y_I[n]+j\ Y_Q[n]$ (equation 2). An input source 335 is available to provide frequency, "$f_o$," which is the frequency of an undesired tone signal that is noisy with the desired signal and that is known for the system 300. An artificial version of the undesired tone signal includes a sampling period of "$T_S$" and the known frequency, which is used to generate an artificial version of the unknown tone signal 375 from digital tone signal generator 385. The artificial version of the unknown tone signal is provided as calculated amplitude of $A \triangleq 2\pi f_o T_S$ (equation 3). Using the calculated amplitude, the digital tone signal generator 305 provides the artificial version of the undesired tone signal, which is mathematically given in the complex I and Q system as a single tone signal with the same frequency ("$f_o$") as the undesired tone signal: $T[n]=\cos(2\pi f_o nT_S)+j\ \sin(2\pi f_o nT_S)=\cos(An)+j\ \sin(An)$ (equation 4).

The artificial version of the unknown tone signal is provided to the complex multiplier 310 and to the complex conjugate multiplier 320. The complex conjugate multiplier 320 combines the filtered output signal "Y[n]" with a conjugate multiplier to provide a digital tone signal 350, "T[n]," to produce error term "E[n]," which is mathematically represented below: $E[n]=Y[n] \times conj(T[n])=\{Y_I[n] \cos(An)+Y_O[n] \sin(An)\}+j\{-Y_I[n] \sin(An)+Y_O[n] \cos(An)\}$ (equation 5). The complex multiplier 310 multiplies the estimated complex phasor value "G[n]" to the generated digital tone signal "T[n]" to produce the estimated noise tone signal on line 370, which is mathematically represented as:

$$G[n] \times T[n] = \{G_{Re}[n] \cos(An) - G_{Im}[n] \sin(An)\} + j\{G_{Re}[n] \sin(An) + G_{Im}[n] \cos(An)\} \quad (equation\ 6).$$

The filtering or subtracting circuit 340 filters or subtracts the estimated noise signal from line 370 to generate the clean digital signal, which is mathematically represented as: $Y[n]=x[n]-G[n] \times T[n]$ (equation 7). A person of ordinary skill would recognize that a summing circuit may function as a subtractor circuit or a filter circuit, and accordingly, the term summing circuit is used interchangeably with the subtractor circuit and the filter circuit to represent a circuit that performs the functions as disclosed herein.

In an aspect of the present disclosure, a variable gain block 325 defines a loop gain that is variable for controlling the speed of convergence of the circuit signals, together with achieving the undesired tone signal removal. The gain is represented as "K[n]." Higher values for "K" gives faster convergence speed, but lower tone signal removal, while lower values for "K" gives slower convergence speed but more precise tone removal. Further, the output 345 from the gain block 325 is a gain difference that is mathematically represented as "ΔG[n]." "K[n]" is a positive real number and it is not a complex number. The gain difference is mathematically calculated as $\Delta G[n]=K[n] \times E[n]$ (equation 8). Another component of the system 300 is accumulator 315, which accumulates the ΔG[n] values to provide the estimate phasor value 365 for the G[n], which is given as $G[n-1]=G[n]+\Delta G[n]$ (equation 9). The feedback via the accumulator 315 with the gain block 325, representing part of the estimate phasor circuit 355, provides the estimate phasor value noted above.

Figure 4:
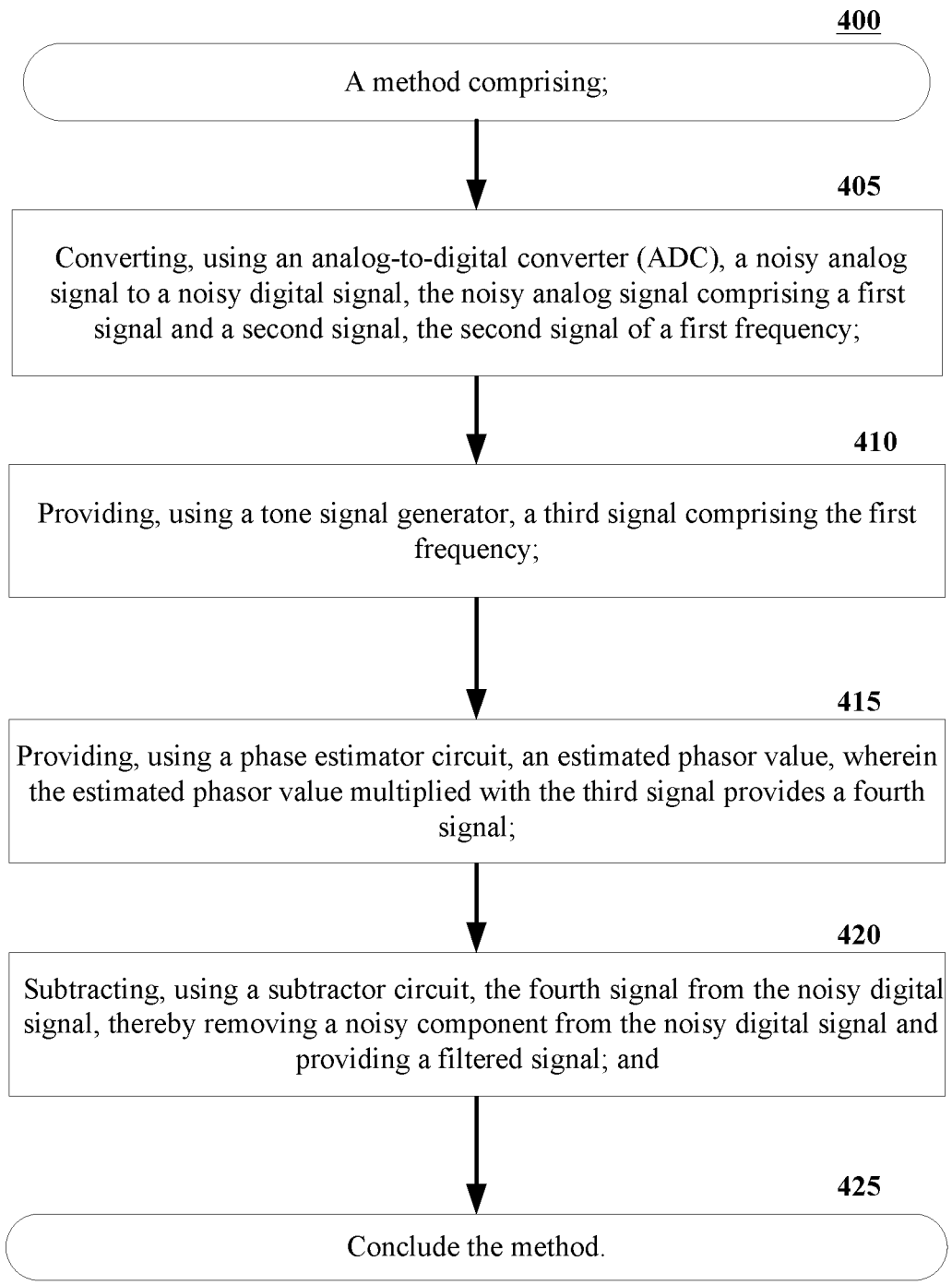
FIG. 4 is a flowchart of a filtering method for tone signal removal, in accordance with various embodiments of the present disclosure.

FIG. 4 is a flowchart of a filtering method 400 for tone signal removal, in accordance with various embodiments of the present disclosure. A converting feature of block 405 uses an analog-to-digital converter (ADC) to convert a noisy analog signal to a noisy digital signal. The noisy analog signal includes a first signal (e.g., original desired signal) and a second signal (e.g., undesired tone signal), where the second signal is of a first frequency (e.g., a known frequency). A providing feature of block 410 uses a signal generator to provide a third signal (e.g., single tone reference signal) including the first frequency. Another providing feature, in block 415, uses a phase estimator circuit to provide an estimated phasor value that when multiplied with the third signal further provides a fourth signal (e.g., estimated undesired tone signal). A subtracting process is applied, via block 420, and using a subtractor circuit, to subtract the fourth signal from the noisy digital signal. The subtracting process removes a noisy component from the noisy analog signal and provides a filtered signal. In the method of FIG. 4, the second signal in the noisy analog signal is the undesired noise or undesired tone signal as previously noted, while the first signal is the original desired signal. Furthermore, the digitalization of the noisy analog signal provide digitalized undesired tone signal and digitalized original desired signal. The fourth signal, noted in an example as an estimated undesired tone signal, represents the generated undesired noise with the known frequency of the undesired noise signal (i.e., the second signal). Block 425 concludes the method 400.

In an aspect of the present disclosure, the artificial tone signal is a nomenclature to a generated tone signal with the same frequency as the unwanted or undesired tone signal existing in combination with a desired signal of a noisy bandwidth signal. A person of ordinary skill would also recognize that the present disclosure is available to filter any signal from a noisy signal, so long as the frequency of the signal to be filtered is known.

The various embodiments can be implemented in a wide variety of operating environments, which in some cases can include one or more user electronic devices, integrated circuits, chips, and computing devices—each with the proper configuration of hardware, software, and/or firmware as presently disclosed. Such a system can also include a number of the above exemplary systems working together to perform the same function disclosed herein—to filter tone signals from a noisy signal using novel integrated circuits in a communications network.

Most embodiments utilize at least one communications network that would be familiar to those skilled in the art for supporting communications using any of a variety of commercially-available protocols, such as TCP/IP, FTP, UPnP, NFS, and CIFS. The communications network can be, for example, a cable network, a local area network, a wide-area network, a virtual private network, the Internet, an intranet, an extranet, a public switched telephone network, an infrared network, a wireless network, and any combination thereof.

The environment can include a variety of data stores and other memory and storage media as discussed above—including at least a buffer. These storage components can reside in a variety of locations, such as on a storage medium local to (and/or resident in) one or more of the computers or remote from any or all the computers across the network. In a set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer, or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can relate to, or configured to receive, a computer-readable storage medium representing remote, local, fixed and/or removable storage devices as well as storage media for temporarily and/or more permanently containing, storing, transmitting, and retrieving computer-readable information. The system and various devices also typically will include several software applications, modules, services, or other elements located within at least one working memory device, including an operating system and application programs such as a client application or Web browser. It should be appreciated that alternate embodiments may have numerous variations from that described above. For example, customized hardware might also be used and/or elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system comprising:
   an analog-to-digital converter (ADC) for converting a noisy analog signal to a noisy digital signal, the noisy analog signal comprising a first signal and a second signal, the second signal of a first frequency;
   a tone signal generator for providing a third signal comprising the first frequency;
   a phase estimator circuit for generating an estimated phasor value, the estimated phasor value multiplied with the third signal to provide a fourth signal;
   a subtractor circuit for subtracting the fourth signal from the noisy digital signal, thereby removing a noisy component from the noisy digital signal and providing a filtered signal; and
   a feedback circuit in the phasor estimator circuit, the feedback circuit comprising a complex conjugate multiplier for complex conjugate multiplication of the filtered signal and the third signal, the complex conjugate multiplication generating an error signal for generating at least a component of the fourth signal.

2. The system of claim 1, where the second signal is a noise signal.

3. The system of claim 1, where the second signal is of unknown amplitude and unknown phase in the noisy analog signal.

4. The system of claim 1, where the second signal is a baseband signal comprising in-phase (I) and quadrature phase (Q) components.

5. The system of claim 1, where the signal generator is a tone signal generator for generating complex tone signals comprising in-phase (I) and quadrature phase (Q) components.

6. The system of claim 1, wherein the feedback circuit comprises a variable gain circuit defining a loop gain, and wherein the error signal is multiplied with the loop gain to generate a time-based component of the fourth signal.

7. The system of claim 6, wherein the feedback circuit comprises an accumulator circuit for accumulating the components of the fourth signal over a time period, thereby generating the fourth signal.

8. The system of claim 1, wherein the feedback circuit comprises an accumulator circuit for accumulating the components of the fourth signal over time, thereby generating the fourth signal.

9. A method comprising:
   converting, using an analog-to-digital converter (ADC), a noisy analog signal to a noisy digital signal, the noisy analog signal comprising a first signal and a second signal, the second signal of a first frequency;
   providing, using a tone signal generator, a third signal comprising the first frequency;
   providing, using a phase estimator circuit, an estimated phasor value, wherein the estimated phasor value multiplied with the third signal provides a fourth signal;
   subtracting, using a subtractor circuit, the fourth signal from the noisy digital signal, thereby removing a noisy component from the mixed digital signal and providing a filtered signal; and
   performing complex conjugate multiplication, using a feedback circuit comprising a complex conjugate multiplier, of the filtered signal and the third signal, the complex conjugate multiplication generating an error signal for generating at least a component of the fourth signal.

10. The method of claim 9, where the second signal is a noise signal.

11. The method of claim 9, where the second signal is of unknown amplitude and unknown phase in the noisy analog signal.

12. The method of claim 9, where the second signal is a baseband signal comprising in-phase (I) and quadrature phase (Q) components.

13. The method of claim 9, where the signal generator is a tone signal generator for generating complex tone signals comprising in-phase (I) and quadrature phase (Q) components.

14. The method of claim 9, wherein the feedback circuit comprises a variable gain circuit defining a loop gain, and wherein the error signal is multiplied with the loop gain to generate a time-based component of the fourth signal.

15. The method of claim 14, wherein the feedback circuit comprises an accumulator circuit for accumulating the components of the fourth signal over a time period, thereby generating the fourth signal.

16. The method of claim 9, wherein the feedback circuit comprises an accumulator circuit for accumulating the components of the fourth signal over time, thereby generating the fourth signal.

* * * * *